United States Patent
Hsu et al.

(10) Patent No.: US 9,633,588 B2
(45) Date of Patent: Apr. 25, 2017

(54) PANEL INSPECTION APPARATUS AND DISPLAY PANEL

(71) Applicant: SHENZHEN CHINA STAR OPTOELECTRONICS TECHNOLOGY CO., LTD., Shenzhen (CN)

(72) Inventors: Jehao Hsu, Shenzhen (CN); Qibiao Lv, Shenzhen (CN)

(73) Assignee: SHENZHEN CHINA STAR OPTOELECTRONICS TECHNOLOGY CO., LTD, Shenzhen (CN)

( * ) Notice: Subject to any disclaimer, the term of this patent is extended or adjusted under 35 U.S.C. 154(b) by 628 days.

(21) Appl. No.: 14/234,401

(22) PCT Filed: Nov. 15, 2013

(86) PCT No.: PCT/CN2013/087245
§ 371 (c)(1),
(2) Date: Jan. 23, 2014

(87) PCT Pub. No.: WO2015/058433
PCT Pub. Date: Apr. 30, 2015

(65) Prior Publication Data
US 2015/0120233 A1    Apr. 30, 2015

(30) Foreign Application Priority Data
Oct. 25, 2013 (CN) .......................... 2013 1 0513284

(51) Int. Cl.
G09G 3/00 (2006.01)
G01R 31/317 (2006.01)

(52) U.S. Cl.
CPC ....... G09G 3/006 (2013.01); G01R 31/31724 (2013.01); G09G 2300/0426 (2013.01)

(58) Field of Classification Search
CPC ......... G09G 2310/0264; G09G 3/3688; G09G 2330/12; G09G 3/3677; G09G 3/006; G09G 2300/0426; G01R 19/28; G01R 31/31724
See application file for complete search history.

(56) References Cited

U.S. PATENT DOCUMENTS

2005/0146349 A1* 7/2005 Lai .......................... G09G 3/006
324/760.02
2008/0024471 A1 1/2008 Park et al.
(Continued)

FOREIGN PATENT DOCUMENTS

| CN | 101114414 A | 1/2008 |
| CN | 103280173 A | 9/2013 |

Primary Examiner — Alexander Eisen
Assistant Examiner — Abhishek Sarma
(74) Attorney, Agent, or Firm — Mark M. Friedman

(57) ABSTRACT

A panel inspection apparatus and a display panel are provided in the present invention. The panel inspection apparatus includes a data line detecting circuit and a scan line detecting circuit. The data line detecting circuit includes a data line detection switch, a control line of the data line detection switch, and a data line of the data line detection switch. The scan line detecting circuit includes a scan line detection switch, a control line of the scan line detection switch, and a data line of the scan line detection switch. The present invention further provides a display panel. The panel inspection apparatus does not need to be removed after detection of the panel in accordance with the panel inspection apparatus and the display panel of the present invention. Therefore, production costs of the display panel are reduced, and productivity of the display panel is improved.

15 Claims, 2 Drawing Sheets

(56) References Cited

U.S. PATENT DOCUMENTS

2008/0266277 A1 10/2008 Ichikura et al.
2009/0213288 A1* 8/2009 Chen .................. G02F 1/1303
                349/43

* cited by examiner

PANEL INSPECTION APPARATUS AND DISPLAY PANEL

FIELD OF THE INVENTION

The present invention relates to a display technology, and especially to a panel inspection apparatus and a display panel.

BACKGROUND OF THE INVENTION

A thin-film transistor liquid-crystal display panel is a mainstream display device. In order to guarantee the quality, display units inside the display panel need to be tested in production processes. If quality problems are found, the display units can be repaired in time. This process is known as a cell test. Referring to FIG. 1, FIG. 1 is a schematic drawing illustrating a panel inspection apparatus of the display panel in the prior art. The panel inspection apparatus is disposed on the display panel 15. The panel inspection apparatus is a trace layout of shorting bars 13 which are located at outer margins of a scan line (gate line) driving circuit 11 and a data line driving circuit 12. Test signals are transmitted to each of the display units 14 through the short bars 13 during the detection. After the detection of the panel, the shorting bars 13 need to be cut off from the scan line driving circuit 11 and the data line driving circuit 12 by using a laser. To achieve a narrow bezel of the display panel, edge grinding also needs to be utilized to further grind off the remaining shorting bars 13.

Because of a design of the shorting bars 13 on the conventional panel inspection apparatus, the prior art panel inspection apparatus needs to dispose the shorting bars 13 in the production and needs to remove the shorting bars before the display panel leaves the factory, thus resulting in high production costs and low productivity of the prior art display panel.

Therefore, there is a significant need to provide a panel inspection apparatus and a display panel for solving the problems existing in the prior art.

SUMMARY OF THE INVENTION

An objective of the present invention is to provide a panel inspection apparatus and a display panel low production costs and high productivity to overcome the problems of the high production costs and the low productivity of the panel inspection apparatus and the display panel in the prior art.

To achieve the foregoing objective, the technical solution of this invention is implemented as follows.

The present invention provides a panel inspection apparatus, which is disposed in a display panel. The apparatus includes: a data line detecting circuit disposed on an opposite side of the display panel with respect to a side where a data line driving circuit is disposed, the data line detecting circuit comprising: a data line detection switch utilized to perform detection of the display panel; a control line of the data line detection switch utilized to control the data line detection switch; and a data line of the data line detection switch utilized to input a data line detection signal; and a scan line detecting circuit disposed on an opposite side of the display panel with respect to a side where a scan line driving circuit is disposed, the scan line detecting circuit comprising: a scan line detection switch utilized to perform detection of the display panel; a control line of the scan line detection switch utilized to control the scan line detection switch; and a data line of the scan line detection switch utilized to input a scan line detection signal; wherein the control line of the data line detection switch is coupled to a low potential driving circuit after the detection of the display panel; wherein the control line of the scan line detection switch is coupled to a low potential driving circuit after the detection of the display panel.

The present invention further provides a panel inspection apparatus, which is disposed in a corresponding display panel. The apparatus includes: a data line detecting circuit disposed on an opposite side of the display panel with respect to a side where a data line driving circuit is disposed, the data line detecting circuit comprising: a data line detection switch utilized to perform detection of the display panel; a control line of the data line detection switch utilized to control the data line detection switch; and a data line of the data line detection switch utilized to input a data line detection signal; and a scan line detecting circuit disposed on an opposite side of the display panel with respect to a side where a scan line driving circuit is disposed, the scan line detecting circuit comprising: a scan line detection switch utilized to perform detection of the display panel; a control line of the scan line detection switch utilized to control the scan line detection switch; and a data line of the scan line detection switch utilized to input a scan line detection signal.

In the panel inspection apparatus of the present invention, the data line detection switch includes a first switch and a second switch sequentially connecting in series, an input terminal of the first switch coupled to the data line of the data line detection switch, an output terminal of the first switch coupled to an input terminal of the second switch, an control terminal of the first switch coupled to the control line of the data line detection switch, a control terminal of the second switch coupled to the control line of the data line detection switch, an output terminal of the second switch coupled to a data line of the display panel.

In the panel inspection apparatus of the present invention, the scan line detection switch includes a third switch and a fourth switch sequentially connecting in series, an input terminal of the third switch coupled to the data line of the data line detection switch, an output terminal of the third switch coupled to an input terminal of the fourth switch, an control terminal of the third switch coupled to the control line of the scan line detection switch, a control terminal of the fourth switch coupled to the control line of the scan line detection switch, an output terminal of the fourth switch coupled to a scan line of the display panel.

In the panel inspection apparatus of the present invention, the control line of the data line detection switch and the data line of the data line detection switch are integrally formed.

In the panel inspection apparatus of the present invention, after the detection of the display panel, the control line of the data line detection switch is coupled to a low potential driving circuit.

In the panel inspection apparatus of the present invention, after the detection of the display panel, the control line of the scan line detection switch is coupled to a low potential driving circuit.

In the panel inspection apparatus of the present invention, the data line detection switch includes at least two switches sequentially connecting in series, and the scan line detection switch includes at least two switches sequentially connecting in series.

The present invention further provides a display panel, which includes: a substrate; a data line disposed on the substrate; a scan line disposed on the substrate; a data line driving circuit utilized to input a data signal into the data line; a scan line driving circuit utilized to input a scan signal into the scan line; and a panel inspection apparatus utilized to perform detection of the display panel, comprising: a data line detecting circuit disposed on an opposite side with respect to a side where the data line driving circuit is disposed, comprising: a data line detection switch utilized to perform detection of the display panel; a control line of the data line detection switch utilized to control the data line detection switch; and a data line of the data line detection switch utilized to input a data line detection signal; and a scan line detecting circuit disposed on an opposite side with respect to a side where the scan line driving circuit is disposed, comprising: a scan line detection switch utilized to perform detection of the display panel; a control line of the scan line detection switch utilized to control the scan line detection switch; and a data line of the scan line detection switch utilized to input a scan line detection signal.

In the display panel of the present invention, the data line detection switch includes a first switch and a second switch sequentially connecting in series, an input terminal of the first switch coupled to the data line of the data line detection switch, an output terminal of the first switch coupled to an input terminal of the second switch, an control terminal of the first switch coupled to the control line of the data line detection switch, a control terminal of the second switch coupled to the control line of the data line detection switch, an output terminal of the second switch coupled to a data line of the display panel.

In the display panel of the present invention, the scan line detection switch includes a third switch and a fourth switch sequentially connecting in series, an input terminal of the third switch coupled to the data line of the data line detection switch, an output terminal of the third switch coupled to an input terminal of the fourth switch, an control terminal of the third switch coupled to the control line of the scan line detection switch, a control terminal of the fourth switch coupled to the control line of the scan line detection switch, an output terminal of the fourth switch coupled to a scan line of the display panel.

In the display panel of the present invention, the control line of the data line detection switch and the data line of the data line detection switch are integrally formed.

In the display panel of the present invention, after the detection of the display panel, the control line of the data line detection switch is coupled to a low potential driving circuit.

In the display panel of the present invention, after the detection of the display panel, the control line of the scan line detection switch is coupled to a low potential driving circuit.

In the display panel of the present invention, the data line detection switch comprises at least two switches sequentially connecting in series, and the scan line detection switch comprises at least two switches sequentially connecting in series.

In comparison with the prior art panel inspection apparatus and display panel, the panel inspection apparatus does not need to be removed after the detection of the panel in accordance with the panel inspection apparatus and the display panel of the present invention. Thus, the production costs of the display panel are reduced, and the productivity of the display panel is improved, thereby overcoming the problems of the high production costs and the low productivity of the panel inspection apparatus and the display panel in the prior art.

It is to be understood that both the foregoing general description and the following detailed description of the present invention are exemplary and explanatory and are intended to provide further explanation of the invention as claimed.

DETAILED DESCRIPTION OF THE PREFERRED EMBODIMENTS

Figure 1:
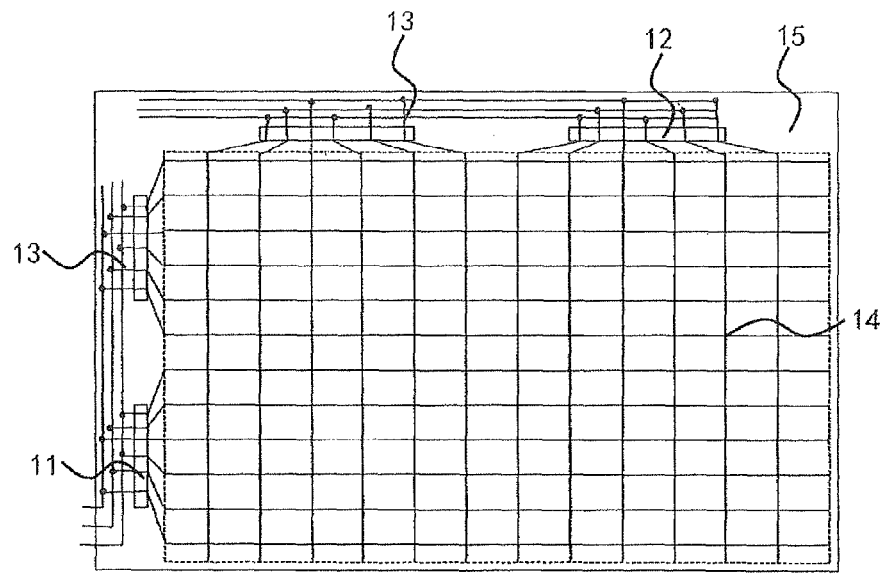
FIG. 1 is a schematic drawing illustrating a panel inspection apparatus of a display panel in the prior art.

Descriptions of the following embodiments refer to attached drawings which are utilized to exemplify specific embodiments. Directional terms mentioned in the present invention, such as "top" and "down", "front", "rear", "left", "right", "inside", "outside", "side" and so on are only directions with respect to the attached drawings. Therefore, the used directional terms are utilized to explain and understand the present invention but not to limit the present invention.

In different drawings, the same reference numerals refer to like parts throughout the drawings.

Figure 2:
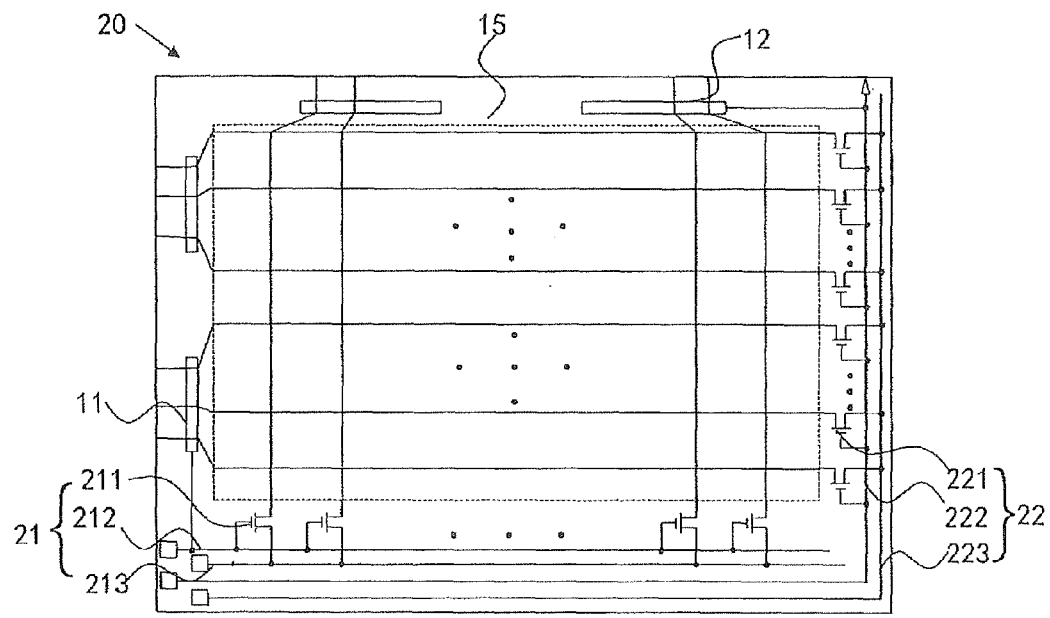
FIG. 2 is a schematic drawing illustrating a panel inspection apparatus according to a first preferred embodiment of the present invention.

Referring to FIG. 2, FIG. 2 is a schematic drawing illustrating a panel inspection apparatus according to a first preferred embodiment of the present invention. The panel inspection apparatus 20 of the preferred embodiment is disposed on the substrate 15 of the corresponding display panel and utilized to perform detection of the display panel. The display panel can be a thin-film transistor liquid-crystal display (TFT-LCD) panel, an organic light emitting display (OLED) panel, a polymer light emitting display (PLED) panel, and so on. The panel inspection apparatus 20 includes a data line detecting circuit 21 and a scan line detecting circuit 22.

The data line detecting circuit 21 is disposed on an opposite side of the display panel with respect to a side where a data line driving circuit 12 is disposed. The data line detecting circuit 21 includes a data line detection switch 211, a control line 212 of the data line detection switch 211, and a data line 213 of the data line detection switch 211. The data line detection switch 211 is utilized to perform the detection of the display panel; the control line 212 of the data line detection switch 211 is utilized to control the data line detection switch 211; the data line 213 of the data line detection switch 211 is utilized to input a data line detection signal.

The scan line detecting circuit 22 is disposed on an opposite side of the display panel with respect to a side where a scan line driving circuit 11 is disposed. The scan line detecting circuit 22 includes a scan line detection switch 221, a control line 222 of the scan line detection switch 221, and a data line 223 of the scan line detection switch 221. The scan line detection switch 221 is utilized to perform the detection of the display panel; the control line 222 of the scan line detection switch 221 is utilized to control the scan line detection switch 211; the data line 223 of the scan line detection switch 221 is utilized to input a scan line detection signal.

The data line detection switch 211 of the preferred embodiment is a first switch. An input terminal of the first switch is coupled to the data line 213 of the data line detection switch 211; an output terminal of the first switch is coupled to a data line of the display panel; a control terminal of the first switch is coupled to the control line 212 of the data line detection switch 211.

The scan line detection switch 221 of the preferred embodiment is a third switch. An input terminal of the third switch is coupled to the data line 223 of the scan line detection switch 221; an output terminal of the third switch is coupled to a scan line of the display panel; a control terminal of the third switch is coupled to the control line 222 of the scan line detection switch 221.

When the panel inspection apparatus 20 of the preferred embodiment performs the detection of the display panel, the first switch is turned on via the control line 212 of the data line detection switch 211, and the third switch is turned on via the control line 222 of the scan line detection switch 221. Then the data line 223 of the scan line detection switch 221 inputs a scan detection signal into the scan line of the display panel via the third switch; the data line 213 of the data line detection switch 221 inputs a data detection signal into the data line of the display panel via the first switch. Accordingly, the corresponding display unit carries out a light-on test through the scan detection signal and the data detection signal.

The panel inspection apparatus 20 of the preferred embodiment configures the data line detecting circuit 21 to be disposed on the opposite side of the display panel with respect to the side where the data line driving circuit 12 is disposed and configures the scan line detecting circuit 22 to be disposed on the opposite side of the display panel with respect to the side where the scan line driving circuit 11 is disposed. This saves trace space on the sides of the data line driving circuit 12 and the scan line driving circuit 11 and facilitates the design of a narrow bezel for the display panel. Moreover, because the opposite side of the data line driving circuit 12 and the opposite side of the scan line driving circuit 11 have more ample trace space, the panel inspection apparatus 20 does not need to be removed after the panel is tested by the panel inspection apparatus 20.

The panel inspection apparatus does not need to be removed after the detection of the panel in accordance with the panel inspection apparatus of the preferred embodiment. Therefore, the production costs of the display panel are reduced, and the productivity of the display panel is improved.

Figure 3:
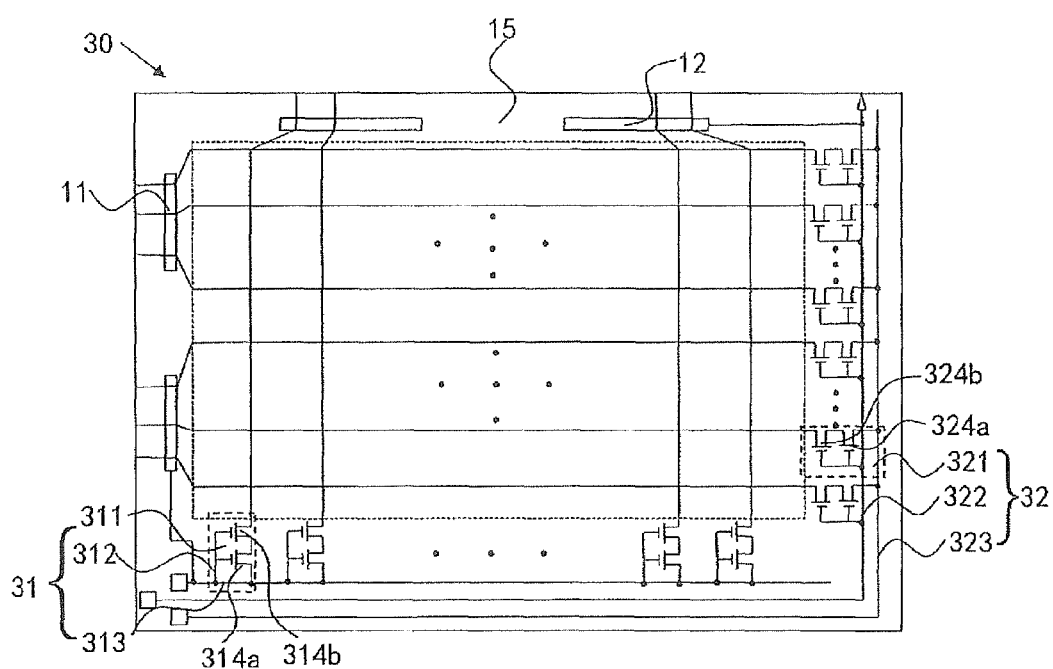
FIG. 3 is a schematic drawing illustrating a panel inspection apparatus according to a second preferred embodiment of the present invention.

Referring to FIG. 3, FIG. 3 is a schematic drawing illustrating a panel inspection apparatus according to a second preferred embodiment of the present invention. The panel inspection apparatus 30 of the preferred embodiment is disposed on the substrate 15 of the corresponding display panel. The panel inspection apparatus 30 includes a data line detecting circuit 31 and a scan line detecting circuit 32.

The data line detecting circuit 31 is disposed on an opposite side of the display panel with respect to a side where a data line driving circuit 12 is disposed. The data line detecting circuit 21 includes a data line detection switch 311, a control line 312 of the data line detection switch 311, and a data line 313 of the data line detection switch 311. The scan line detecting circuit 32 is disposed on an opposite side of the display panel with respect to a side where a scan line driving circuit 11 is disposed. The scan line detecting circuit 32 includes a scan line detection switch 321, a control line 322 of the scan line detection switch 321, and a data line 323 of the scan line detection switch 321.

The difference between the panel inspection apparatus 30 of the preferred embodiment and that of the first preferred embodiment is that the data line detection switch 311 of the preferred embodiment includes a first switch 314a and a second switch 314b sequentially connecting in series. An input terminal of the first switch 314a is coupled to the data line 313 of the data line detection switch 311; an output terminal of the first switch 314a is coupled to an input terminal of the second switch 314b; an control terminal of the first switch 314a is coupled to the control line 312 of the data line detection switch 311; a control terminal of the second switch 314b is coupled to the control line 312 of the data line detection switch 311. An output terminal of the second switch 314b is coupled to the data line of the display panel.

The scan line detection switch 321 of the preferred embodiment includes a third switch 324a and a fourth switch 324b sequentially connecting in series. An input terminal of the third switch 324a is coupled to the data line 323 of the scan line detection switch 321; an output terminal of the third switch 324a is coupled to an input terminal of the fourth switch 324b; an control terminal of the third switch 324a is coupled to the control line 322 of the scan line detection switch 311; a control terminal of the fourth switch 324b is coupled to the control line 322 of the scan line detection switch 321; an output terminal of the fourth switch 324b is coupled to the scan line of the display panel.

The control line 312 of the data line detection switch 311 and the data line 313 of the data line detection switch 311 of the preferred embodiment are integrally formed. After the detection of the display panel, the control line 312 of the data line detection switch 311 is coupled to a low potential driving circuit, and the control line 322 of the scan line detection switch 321 is coupled to a low potential driving circuit. For example, the control line 312 of the data line detection switch 311 is coupled to the data line driving circuit 12, the scan line driving circuit 11, or ground for receiving a low-potential driving signal. For example, the control line 322 of the scan line detection switch 321 is coupled to the data line driving circuit 12, the scan line driving circuit 11, or ground for receiving a low-potential driving signal. The preferable low potential driving circuit corresponding to the control line 312 of the data line detection switch 311 is different from the low potential driving circuit corresponding to the control line 322 of the scan line detection switch 321, to ensure the stability of the low-potential driving signal.

When the panel inspection apparatus 30 of the preferred embodiment performs the detection of the display panel, the first switch 314a and the second switch 314b are turned on via the control line 312 of the data line detection switch 311, and the third switch 324a and the fourth switch 324b are turned on via the control line 322 of the scan line detection switch 321. Then the data line 323 of the scan line detection switch 321 inputs the scan detection signal into the scan line of the display panel via the third switch 324a and the fourth switch 324b; the data line 313 of the data line detection switch 311 inputs the data detection signal into the data line of the display panel via the first switch 314a and the second switch 314b. Accordingly, the corresponding display unit carries out a light-on test through the scan detection signal and the data detection signal.

Both the scan line detection switch 321 and the data line detection switch 311 employ the structure of the twin switches. Accordingly, even if leakage of one switch thereof occurs, the other switch still can guarantee the scan line detection switch 321 and the data line detection switch 311 being in a closed state. Thus, a risk of an abnormal display of the panel display resulting form the leakage of the scan line detection switch 321 and the data line detection switch 311 is greatly reduced.

Meanwhile, because the signals outputted from the data line 313 of the data line detection switch 311 are all positive bias signals, the control line 312 of the data line detection switch 311 and the data line 313 of the data line detection switch 311 can be integrally formed, and the first switch 314a and the second switch 314b can be driven by the positive bias signals outputted from the data line 313 of the data line detection switch 311. This can further reduce the traces of the panel inspection apparatus 30. Because the signals outputted from the data line 323 of the scan line detection switch 321 includes the positive bias signals and negative bias signals, the control line 322 of the scan line detection switch 321 and the data line 323 of the scan line detection switch 321 can not be integrally formed.

After the detection of the display panel is completed by the panel inspection apparatus 30 of the preferred embodiment, the control line 312 of the data line detection switch 311 (i.e. data line 313 of the data line detection switch 311) can be coupled to a low potential driving circuit. In FIG. 3, it is coupled to the scan line driving circuit 11 for receiving a low-potential driving signal. Meanwhile, the control line 322 of the scan line detection switch 321 can be coupled to a low potential driving circuit. In FIG. 3, it is coupled to the data line driving circuit 12 receiving a low-potential driving signal. Accordingly, during normal use of the display panel, the control line 312 of the data line detection switch 311 will input a low potential signal to the first switch 314a and the second switch 314b, and the control line 322 of the scan line detection switch 321 will input a low potential signal to the third switch 324a and the fourth switch 324b, to ensure that the data line detection switch 311 and the scan line detection switch 321 are completely in the closed state during the use of the display panel, to further avoid the leakage phenomenon. Certainly, the control line 312 of the data line detection switch 311 and the control line 322 of the scan line detection switch 321 herein also can be coupled to the low potential driving circuit by other ways, such as directly coupling to the ground. The scope of the present invention should not be limited to the specific ways of the control line 312 of the data line detection switch 311 and the control line 322 of the scan line detection switch 321 being coupled to the low potential driving circuit.

The data line detection switch 311 and the scan line detection switch 321 of the preferred embodiment also can be three switches sequentially connecting in series, i.e. triple switch structure. Such structures of the data line detection switch 311 and the scan line detection switch 321 are capable of enhancing the effect of leakage prevention, but more switches will take up more space and increase the production costs. Therefore, the number of the switches in the data line detection switch 311 and the scan line detection switch 321 can be designed according to user's actual needs.

The panel inspection apparatus of the preferred embodiment further improves working stability of the display panel by employing the configuration of the twin switches based on the first preferred embodiment. Meanwhile, the production costs of the display panel are further reduced by integrally forming the control line of the data line detection switch and the data line of the data line detection switch.

The present invention further provides a display panel. The display panel includes a substrate, a data line, a scan line, a data line driving circuit, a scan line driving circuit, and a panel inspection apparatus. The data line is disposed on the substrate, and the scan line is also disposed on the substrate. The data line driving circuit is utilized to input a data signal into the data line, and the scan line driving circuit is utilized to input a scan signal into the scan line. The panel inspection apparatus is utilized to perform the detection of the display panel.

The panel inspection apparatus includes the data line detecting circuit and the scan line detecting circuit. The data line detecting circuit is disposed on an opposite side of the display panel with respect to a side where the data line driving circuit is disposed. The data line detecting circuit includes a data line detection switch, a control line of the data line detection switch, and a data line of the data line detection switch. The scan line detecting circuit is disposed on an opposite side of the display panel with respect to a side where the scan line driving circuit is disposed. The scan line detecting circuit includes a scan line detection switch, a control line of the scan line detection switch, and a data line of the scan line detection switch.

The operating principle of the display panel of the present invention is the same or similar to relevant description of the above-mentioned panel inspection apparatus of the preferred embodiments. For details, please refer to the relevant description of the above-mentioned panel inspection apparatus of the preferred embodiments.

The panel inspection apparatus does not need to be removed after the detection of the panel in accordance with the panel inspection apparatus and the display panel of the present invention. Thus, the production costs of the display panel are reduced, and the productivity of the display panel is improved, thereby overcoming the problems of the high production costs and the low productivity of the panel inspection apparatus and the display panel in the prior art.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A panel inspection apparatus disposed in a display panel, comprising:
    a data line detecting circuit disposed on an opposite side of the display panel with respect to a side where a data line driving circuit is disposed, the data line detecting circuit comprising:
    a data line detection switch utilized to perform detection of the display panel;
    a control line of the data line detection switch utilized to control the data line detection switch; and
    a data line of the data line detection switch utilized to input a data line detection signal; and
    a scan line detecting circuit disposed on an opposite side of the display panel with respect to a side where a scan line driving circuit is disposed, the scan line detecting circuit comprising:
    a scan line detection switch utilized to perform detection of the display panel;
    a control line of the scan line detection switch utilized to control the scan line detection switch; and
    a data line of the scan line detection switch utilized to input a scan line detection signal;

wherein the control line of the data line detection switch is coupled to a first low potential driving circuit after the detection of the display panel;

wherein the control line of the scan line detection switch is coupled to a second low potential driving circuit after the detection of the display panel;

wherein the first low potential driving circuit corresponding to the control line of the data line detection switch is different from the second low potential driving circuit corresponding to the control line of the scan line detection switch.

2. The panel inspection apparatus according to claim 1, wherein the data line detection switch comprises a first switch and a second switch sequentially connecting in series, an input terminal of the first switch coupled to the data line of the data line detection switch, an output terminal of the first switch coupled to an input terminal of the second switch, an control terminal of the first switch coupled to the control line of the data line detection switch, a control terminal of the second switch coupled to the control line of the data line detection switch, an output terminal of the second switch coupled to a data line of the display panel.

3. The panel inspection apparatus according to claim 2, wherein the scan line detection switch comprises a third switch and a fourth switch sequentially connecting in series, an input terminal of the third switch coupled to the data line of the scan line detection switch, an output terminal of the third switch coupled to an input terminal of the fourth switch, an control terminal of the third switch coupled to the control line of the scan line detection switch, a control terminal of the fourth switch coupled to the control line of the scan line detection switch, an output terminal of the fourth switch coupled to a scan line of the display panel.

4. The panel inspection apparatus according to claim 2, wherein the control line of the data line detection switch and the data line of the data line detection switch are integrally formed.

5. The panel inspection apparatus according to claim 1, wherein the data line detection switch comprises at least two switches sequentially connecting in series, and the scan line detection switch comprises at least two switches sequentially connecting in series.

6. A panel inspection apparatus disposed in a display panel, comprising:
a data line detecting circuit disposed on an opposite side of the display panel with respect to a side where a data line driving circuit is disposed, the data line detecting circuit comprising:
a data line detection switch utilized to perform detection of the display panel;
a control line of the data line detection switch utilized to control the data line detection switch; and
a data line of the data line detection switch utilized to input a data line detection signal; and
a scan line detecting circuit disposed on an opposite side of the display panel with respect to a side where a scan line driving circuit is disposed, the scan line detecting circuit comprising:
a scan line detection switch utilized to perform detection of the display panel;
a control line of the scan line detection switch utilized to control the scan line detection switch; and
a data line of the scan line detection switch utilized to input a scan line detection signal;
wherein the control line of the data line detection switch is coupled to a first low potential driving circuit after the detection of the display panel;

wherein the control line of the scan line detection switch is coupled to a second low potential driving circuit after the detection of the display panel; and wherein the first low potential driving circuit corresponding to the control line of the data line detection switch is different from the second low potential driving circuit corresponding to the control line of the scan line detection switch.

7. The panel inspection apparatus according to claim 6, wherein the data line detection switch comprises a first switch and a second switch sequentially connecting in series, an input terminal of the first switch coupled to the data line of the data line detection switch, an output terminal of the first switch coupled to an input terminal of the second switch, an control terminal of the first switch coupled to the control line of the data line detection switch, a control terminal of the second switch coupled to the control line of the data line detection switch, an output terminal of the second switch coupled to a data line of the display panel.

8. The panel inspection apparatus according to claim 7, wherein the scan line detection switch comprises a third switch and a fourth switch sequentially connecting in series, an input terminal of the third switch coupled to the data line of the scan line detection switch, an output terminal of the third switch coupled to an input terminal of the fourth switch, an control terminal of the third switch coupled to the control line of the scan line detection switch, a control terminal of the fourth switch coupled to the control line of the scan line detection switch, an output terminal of the fourth switch coupled to a scan line of the display panel.

9. The panel inspection apparatus according to claim 7, wherein the control line of the data line detection switch and the data line of the data line detection switch are integrally formed.

10. The panel inspection apparatus according to claim 6, wherein the data line detection switch comprises at least two switches sequentially connecting in series, and the scan line detection switch comprises at least two switches sequentially connecting in series.

11. A display panel comprising:
a substrate:
a data line disposed on the substrate;
a scan line disposed on the substrate;
a data line driving circuit utilized to input a data signal into the data line;
a scan line driving circuit utilized to input a scan signal into the scan line; and
a panel inspection apparatus utilized to perform detection of the display panel, comprising:
a data line detecting circuit disposed on an opposite side with respect to a side where the data line driving circuit is disposed, comprising:
a data line detection switch utilized to perform detection of the display panel;
a control line of the data line detection switch utilized to control the data line detection switch; and
a data line of the data line detection switch utilized to input a data line detection signal; and
a scan line detecting circuit disposed on an opposite side with respect to a side where the scan line driving circuit is disposed, comprising:
a scan line detection switch utilized to perform detection of the display panel;
a control line of the scan line detection switch utilized to control the scan line detection switch; and
a data line of the scan line detection switch utilized to input a scan line detection signal;

wherein the control line of the data line detection switch is coupled to a first low potential driving circuit after the detection of the display panel;

wherein the control line of the scan line detection switch is coupled to a second low potential driving circuit after the detection of the display panel; and wherein the first low potential driving circuit corresponding to the control line of the data line detection switch is different from the second low potential driving circuit corresponding to the control line of the scan line detection switch.

12. The display panel according to claim 11, wherein the data line detection switch comprises a first switch and a second switch sequentially connecting in series, an input terminal of the first switch coupled to the data line of the data line detection switch, an output terminal of the first switch coupled to an input terminal of the second switch, an control terminal of the first switch coupled to the control line of the data line detection switch, a control terminal of the second switch coupled to the control line of the data line detection switch, an output terminal of the second switch coupled to a data line of the display panel.

13. The display panel according to claim 12, wherein the scan line detection switch comprises a third switch and a fourth switch sequentially connecting in series, an input terminal of the third switch coupled to the data line of the scan line detection switch, an output terminal of the third switch coupled to an input terminal of the fourth switch, an control terminal of the third switch coupled to the control line of the scan line detection switch, a control terminal of the fourth switch coupled to the control line of the scan line detection switch, an output terminal of the fourth switch coupled to a scan line of the display panel.

14. The display panel according to claim 12, wherein the control line of the data line detection switch and the data line of the data line detection switch are integrally formed.

15. The display panel according to claim 11, wherein the data line detection switch comprises at least two switches sequentially connecting in series, and the scan line detection switch comprises at least two switches sequentially connecting in series.

* * * * *